(12) United States Patent  (10) Patent No.: US 8,461,864 B2
Nakagawa  (45) Date of Patent: Jun. 11, 2013

(54) RECEIVING CIRCUIT AND METHODS FOR CONTROLLING AND TESTING THE SAME

(75) Inventor: Yuji Nakagawa, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 9 days.

(21) Appl. No.: 13/041,132

(22) Filed: Mar. 4, 2011

(65) Prior Publication Data

US 2011/0227604 A1  Sep. 22, 2011

(30) Foreign Application Priority Data

Mar. 19, 2010  (JP) .................................. 2010-64330

(51) Int. Cl.
*H03K 19/00* (2006.01)
*H03K 19/003* (2006.01)

(52) U.S. Cl.
USPC .............................................. 326/16; 326/30

(58) Field of Classification Search
None
See application file for complete search history.

(56) References Cited

U.S. PATENT DOCUMENTS

| 6,922,071 | B2 * | 7/2005 | Dabral et al. | 326/26 |
| 7,205,787 | B1 * | 4/2007 | Massoumi et al. | 326/30 |
| 7,898,878 | B2 | 3/2011 | Nguyen et al. | |
| 2010/0289521 | A1 * | 11/2010 | Nakata | 326/30 |
| 2010/0327902 | A1 * | 12/2010 | Shau | 326/30 |

* cited by examiner

*Primary Examiner* — Crystal L Hammond
(74) *Attorney, Agent, or Firm* — Fujitsu Patent Center

(57) ABSTRACT

A receiving circuit includes: a terminating resistor to set a terminating level of a transmission line for transmitting a reception signal including a signal having a first level indicating a preamble; a detection circuit to detect whether a level of the transmission line is the first level or a second level; and an adjustment circuit to adjust a resistance of the terminating resistor, the adjustment circuit adjusting the resistance of the terminating resistor to a value such that the detection circuit detects the level of the transmission line as the second level when a data request is output to a transmitting side.

10 Claims, 11 Drawing Sheets

FIG. 4A
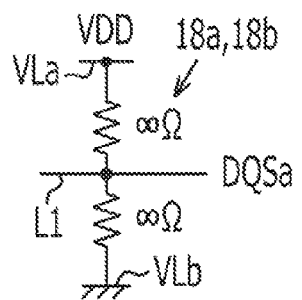
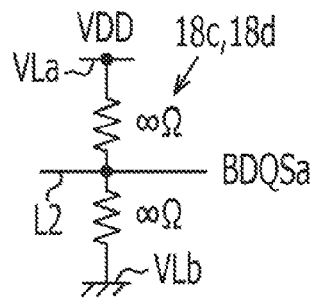
FIG. 4B
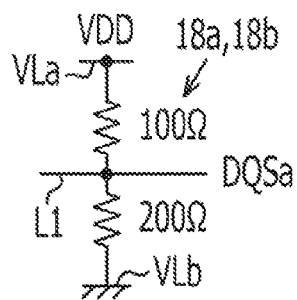
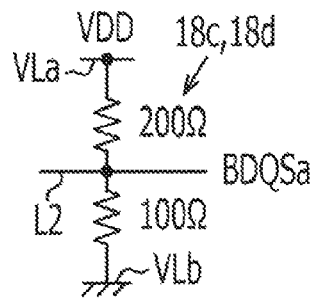
FIG. 4C
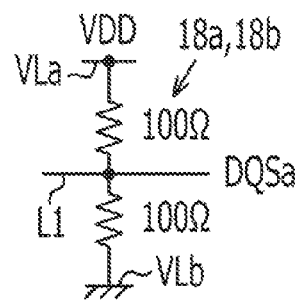
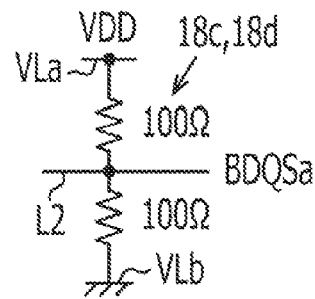

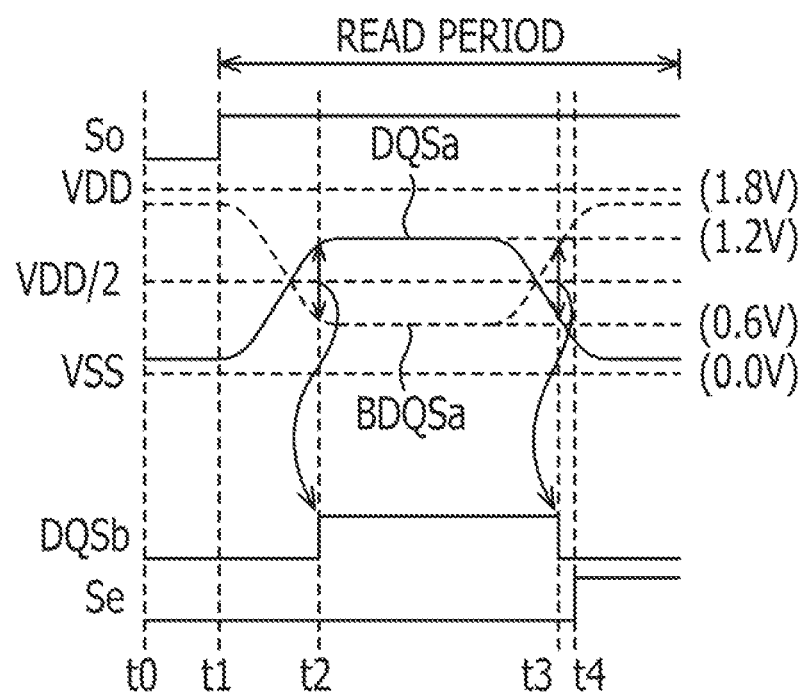

RECEIVING CIRCUIT AND METHODS FOR CONTROLLING AND TESTING THE SAME

CROSS-REFERENCE TO RELATED APPLICATIONS

This application claims the benefit of priority from Japanese Patent Application No. 2010-64330 filed on Mar. 19, 2010, the entire contents of which are incorporated herein by reference.

BACKGROUND

1. Field

The embodiments discussed herein relate to a receiving circuit and methods for controlling and testing the receiving circuit.

2. Description of Related Art

For example, a memory coupled to a system large-scale integrated circuit (LSI) outputs data in synchronization with a data strobe signal which is output. A communication circuit included in the system LSI reads data from the memory in synchronization with the rising edge and the falling edge of the data strobe signal. An internal circuit such as a central processing unit (CPU) included in the system LSI processes the read data.

The related art is disclosed in United States Patent Application 2009/0034344.

SUMMARY

According to one aspect of the embodiments, a receiving circuit includes: a terminating resistor to set a terminating level of a transmission line for transmitting a reception signal including a signal having a first level indicating a preamble; a detection circuit to detect whether a level of the transmission line is the first level or a second level; and an adjustment circuit to adjust a resistance of the terminating resistor, the adjustment circuit adjusting the resistance of the terminating resistor to a value such that the detection circuit detects the level of the transmission line as the second level when a data request is output to a transmitting side.

The object and advantages of the invention will be realized and attained by means of at least the features, elements, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 4A to 4C illustrate an exemplary operation of a terminating circuit;
FIG. 5 illustrates an exemplary operation of an input/output circuit.

DESCRIPTION OF EMBODIMENTS

A communication circuit includes a preamble detection circuit. When the preamble detection circuit detects a preamble state of a transmission line, such as a transition to a low-level state, the preamble detection circuit latches data in synchronization with a data strobe signal subsequent to the preamble state.

Figure 1:
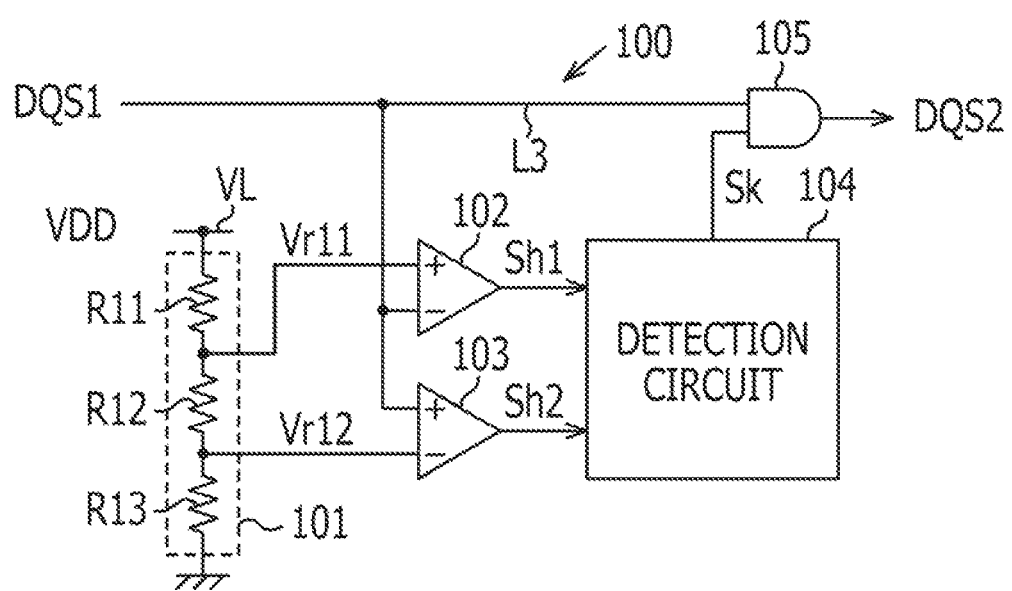
FIG. 1 illustrates an exemplary preamble detection circuit.

FIG. 1 illustrates an exemplary preamble detection circuit. A preamble detection circuit 100 includes a reference voltage generating circuit 101, first and second comparator circuits 102 and 103, a detection circuit 104, and an AND circuit 105. A transmission line L3 through which a data strobe signal DQS1 is transmitted is terminated by a terminating resistor (not illustrated). When the transmission line L3 is at a high impedance, the voltage VDQS1 of the data strobe signal DQS1 is set by the terminating resistor to a middle voltage Vm (=Vdd/2) of a high potential voltage VDD.

In the reference voltage generating circuit 101, first to third resistors R11 to R13 are coupled in series. The reference voltage generating circuit 101 generates a first reference voltage Vr11 (>Vm) that is higher than the middle potential Vm and a second reference voltage Vr12 (<Vm) that is lower than the middle potential Vm. The first comparator circuit 102 compares the voltage VDQS1 of the data strobe signal DQS1 with the first reference voltage Vr11 and outputs a first comparison signal Sh1 in accordance with the comparison result. The second comparator circuit 103 compares the voltage VDQS1 of the data strobe signal DQS1 with the second reference voltage Vr12 and outputs a second comparison signal Sh2 in accordance with the comparison result.

The detection circuit 104 detects the voltage VDQS1 of the data strobe signal DQS1 based on the first and second comparison signals Sh1 and Sh2 respectively output from the first and second comparator circuits 102 and 103. The detection circuit 104 outputs a low-level permission signal Sk when the voltage VDQS1 of the data strobe signal DQS1 is between the first reference voltage Vr11 and the second reference voltage Vr12, and outputs a high-level permission signal Sk when the voltage VDQS1 of the data strobe signal DQS1 is lower than the second reference voltage Vr12.

The AND circuit 105 outputs a data strobe signal DQS2 having a level substantially equal to the data strobe signal DQS1 in response to the high-level permission signal Sk. The AND circuit 105 outputs a low-level data strobe signal DQS2 in response to the low-level permission signal Sk. After the preamble of the data strobe signal DQS1 is detected, the data strobe signal DQS1 (DQS2) is output.

Figure 2A:
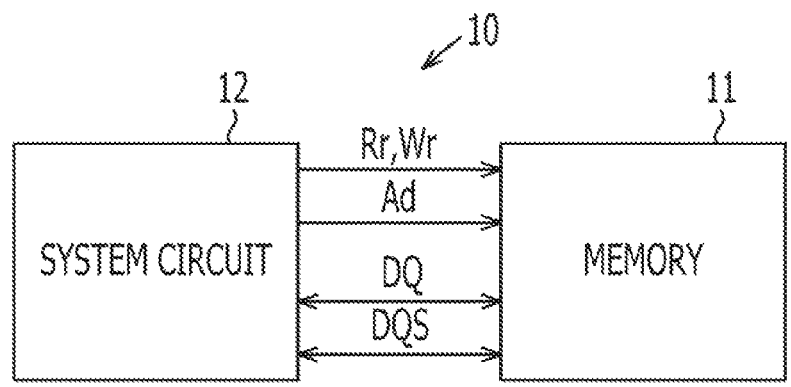
FIGS. 2A and 2B illustrate an exemplary system.
Figure 2B:
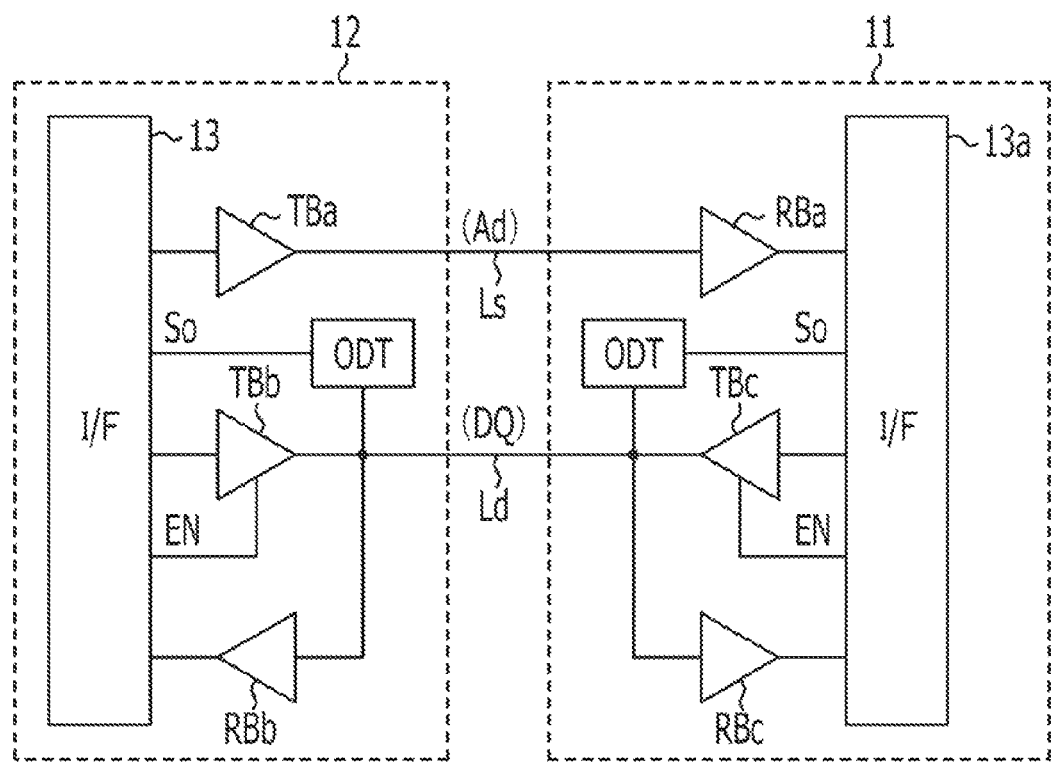

FIG. 2A and FIG. 2B illustrate an exemplary system. A system 10 includes a memory 11, and a system circuit 12 that reads data DQ from the memory 11 or writes data DQ to the memory 11. The memory 11 may be a synchronous semiconductor storage device, such as a double data rate synchronous dynamic random access memory (DDR-SDRAM). For example, the memory 11 and the system circuit 12 may be single chips (LSIs), which may be coupled to each other via a transmission line.

When reading data from the memory 11, the system circuit 12 outputs a read request Rr and an address Ad to the memory 11. The memory 11 outputs a data strobe signal DQS in response to the read request Rr and outputs data DQ in a memory region specified based on the address Ad in synchronization with the data strobe signal DQS. The system circuit 12 takes in the data DQ based on the data strobe signal DQS.

When writing data to the memory 11, the system circuit 12 outputs a write request Wr and an address Ad to the memory 11. The system circuit 12 outputs data DQ to be written to the address Ad in synchronization with a data strobe signal DQS. The memory 11 stores the data DQ taken in based on the data strobe signal DQS in a memory region corresponding to the address Ad, in response to the write request Wr.

The system circuit 12 transmits a signal for controlling the memory 11, such as a read request Rr or an address Ad, to the memory 11 in one-way communication. The system circuit 12 and the memory 11 transmit/receive data DQ and a data strobe signal DQS to/from each other in two-way communication.

FIG. 2B illustrates an exemplary one-way communication and an exemplary two-way communication. A first end (left end in the Figure) of a transmission line Ls used for one-way communication is coupled to an output buffer, such as a transmission buffer TBa, of the system circuit 12. A second end (right end in the Figure) of the transmission line Ls is coupled to an input buffer, such as a reception buffer RBa, of the memory 11. The output buffer TBa drives the transmission line Ls in accordance with a signal output from an interface circuit 13, such as a physical layer circuit 13, for example, an address Ad. The input buffer RBa of the memory 11 outputs a signal in accordance with the level of the transmission line Ls to an interface circuit 13a.

A first end (left end in the Figure) of a transmission line Ld used for two-way communication is coupled to an output buffer TBb and an input buffer RBb included in the system circuit 12. A second end (right end in the Figure) of the transmission line Ld is coupled to an output buffer TBc and an input buffer RBc included in the memory 11. The output buffers TBb and TBc to which the transmission line Ld is coupled may be three-state buffers, which control the state of an output terminal in response to a signal output from the interface circuits 13 and 13a.

For example, when a low-level enable signal EN is supplied, the output buffers TBb and TBc drive the transmission line Ld to a high voltage level, such as an high-level, or a low voltage level, such as an low-level, in response to a transmission signal output from the interface circuits 13 and 13a. The output buffers TBb and TBc set the transmission line Ld to a high impedance in response to a high-level enable signal EN.

Because the transmission line Ld is at a high impedance, collision of signals output from the output buffers TBb and TBc or through current may be reduced. For example, when no signal transmission/reception is performed, the output buffers TBb and TBc of the system circuit 12 and the memory 11 become a high impedance state. The interface circuit 13 of the system circuit 12 outputs the low-level enable signal EN and drives the output buffer TBb, and then outputs a signal, such as data DQ, to the memory 11. The output buffer TBb drives the transmission line Ld to a high-level or a low-level in response to the output signal of the interface circuit 13. The input buffer RBc of the memory 11 outputs a signal in accordance with the level of the transmission line Ld to the interface circuit 13a. The transmission of a signal from the memory 11 to the system circuit 12 is substantially similar.

Terminating circuits ODTs are coupled to two ends of the transmission line Ld. When the transmission line Ld performs two-way communication, the terminating circuits ODTs are activated or deactivated in accordance with a signal transmission direction. When the terminating circuits ODTs are activated, it may be called "ODT ON"; and when the terminating circuits ODTs are deactivated, it may be called "ODT OFF". The terminating circuits ODTs reduce signal reflection. When no communication is performed, the terminating circuits ODTs at both ends are deactivated. When communication is performed, the terminating circuit ODT at a reception side is activated in accordance with a signal transmission direction.

The activated terminating circuit ODT terminates the transmission line Ld. For example, the terminating circuits ODTs each include a first resistor coupled between the transmission line Ld and a power supply line for supplying a high voltage, and a second resistor coupled between the transmission line Ld and a power supply line for supplying a low oltage, such as 0 V. The resistances of the first and second resistors may be substantially equal, and the combined resistances of the first and second resistors may be set to values that match a characteristic impedance of the transmission line Ld. Therefore, when the transmission line Ld is not driven by the output buffers TBb and TBc, for example, when no signal is being output, the terminating circuits ODTs set the transmission line Ld to a level in accordance with the ratio between the resistances of the first and second resistors. When the resistances of the first and second resistors are substantially equal, the transmission line Ld may be set to a middle level of a power supply voltage range set in accordance with the high voltage and the low voltage.

The terminating circuits ODTs are activated or deactivated under control of switch elements coupled in series to the first and second resistors, such as metal oxide semiconductor (MOS) transistors. When the switch elements are turned ON, the transmission line Ld is coupled to the power supply lines via the first and second resistors, thereby terminating the transmission line Ld. When the switch elements are turned OFF, the transmission line Ld is decoupled from the power supply lines.

For example, when transmitting data DQ from the system circuit 12 to the memory 11, as illustrated in FIG. 2A, a write request Wr is transmitted from the system circuit 12 to the memory 11. The interface circuit 13a of the memory 11 outputs, for example, a high-level termination control signal So in response to the write request Wr and activates the terminating circuit ODT based on the termination control signal So.

The memory 11 transmits data DQ to the system circuit 12 in response to a read request Rr from the system circuit 12. When the system circuit 12 reads data from the memory 11, the interface circuit 13 outputs a read request Rr to the memory 11 and then activates the terminating circuit ODT based on the termination control signal So.

The memory 11 reads data in a region corresponding to the address Ad in response to the read request Rr. The interface circuit 13a outputs the low-level enable signal EN. The output buffer TBc may output a signal to the transmission line Ld in response to the enable signal EN. As illustrated in FIG. 2A, the interface circuit 13a outputs the data strobe signal DQS which changes between a high level and a low level at certain cycles, and outputs the data DQ in synchronization with the data strobe signal DQS. The interface circuit 13 of the system circuit 12 generates a signal delayed by a certain time, such as a phase of 90 degrees of the signal DQS, with respect to the data strobe signal DQS, and takes in the data DQ based on the delayed signal.

When no communication is performed, the transmission line Ld for two-way communication is set to a high impedance. Therefore, the level of the transmission line Ld may be unstable, and hence, the data strobe signal DQS transmitted from the memory 11 may not be recognized. The interface circuit 13a of the memory 11 sets the transmission line Ld through which the data strobe signal DQS is transmitted to a low impedance state for a certain time, such as one cycle of a clock signal, and then outputs the data strobe signal DQS. The low impedance state may be referred as "preamble". The interface circuit 13a of the memory 11 sets the transmission line Ld to the low impedance state, such as a low-level. After the interface circuit 13a sets the data strobe signal DQS to the low-level for a certain time, such as half the cycle of the clock signal, by toggling the data strobe signal DQS a number of times in accordance with the number of data blocks to be transmitted, the interface circuit 13a outputs the high-level enable signal EN to the output buffer TBc, thereby setting the transmission line Ld to a high impedance state. The low-level period after the data strobe signal DQS is toggled may be referred as "postamble".

An input/output circuit of the system circuit 12 detects switching of the transmission line Ld from the high impedance state to the low impedance state, such as switching of the transmission line Ld to the low-level, and outputs the data strobe signal DQS to the interface circuit 13. In a read operation, the input/output circuit may transmit the data strobe signal DQS, which toggles, supplied from the memory 11 via the transmission line Ld for a period from the preamble to the postamble (hereinafter referred as "read period") to the interface circuit 13, and may not transmit the level of the transmission line Ld to the interface circuit 13 in a period other than the read period. The level of the transmission line Ld for two-way communication changes based on the data strobe signal DQS transmitted from the system circuit 12 to the memory 11. The interface circuit 13 may mistakenly recognize the level of the transmission line Ld as a data strobe signal in a period other than the read period.

Figure 3:
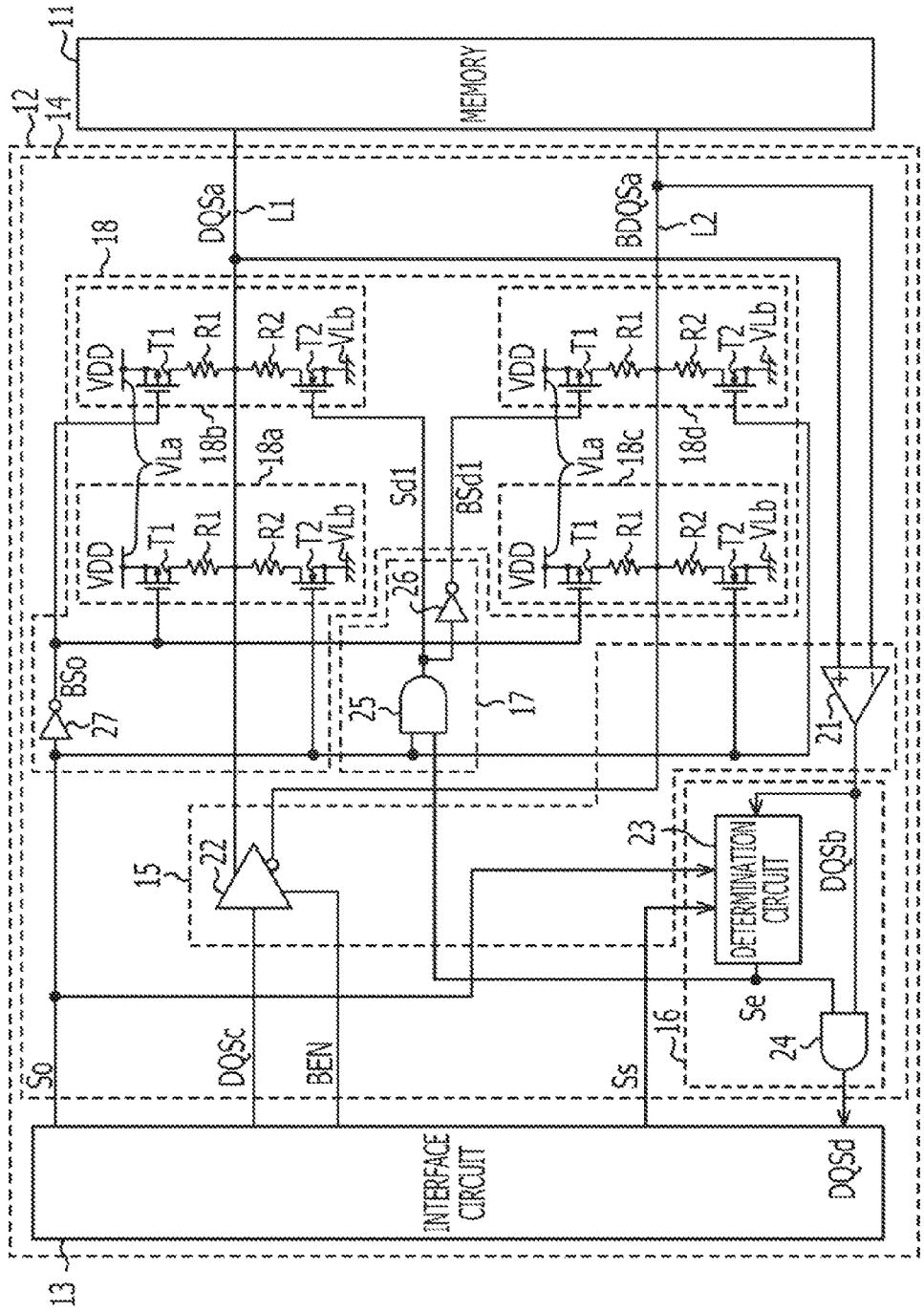
FIG. 3 illustrates an exemplary input/output circuit.

FIG. 3 illustrates an exemplary input/output circuit. An input/output circuit 14 includes a buffer circuit 15, a signal control circuit 16, a termination control circuit 17, and a terminating circuit 18.

The buffer circuit 15 includes an input buffer circuit 21 and an output buffer circuit 22. The data strobe signal DQS may be a differential signal. The data strobe signal DQS includes a data strobe signal DQSa transmitted via a first transmission line L1 and an inverted data strobe signal BDQSa transmitted via a second transmission line L2.

The input buffer circuit 21 includes a differential amplifier. The first transmission line L1 is coupled to a non-inverting input terminal, and the second transmission line L2 is coupled to an inverting input terminal. The input buffer circuit 21 generates a data strobe signal DQSb in accordance with the differential voltage between the data strobe signal DQSa and the inverted data strobe signal BDQSa.

The input buffer circuit 21 outputs the high-level data strobe signal DQSb when the differential voltage between the two signals DQSa and BDQSa is greater than a positive-side threshold voltage. The input buffer circuit 21 outputs the low-level data strobe signal DQSb when the differential voltage between the two signals DQSa and BDQSa is less than a negative-side threshold voltage. For example, the positive-side threshold voltage may be set to 0.5 V, and the negative-side threshold voltage may be set to −0.5 V.

The output buffer circuit 22 receives, from the interface circuit 13, a data strobe signal DQSc for data to be transmitted to the memory 11. The output buffer circuit 22 may include a differential output buffer. A non-inverting output terminal is coupled to the first transmission line L1, and an inverting output terminal is coupled to the second transmission line L2. The output buffer circuit 22 outputs the data strobe signal DQSa having a level substantially equal to a logic level of the data strobe signal DQSc to the first transmission line L1, and outputs the inverted data strobe signal BDQSa at a level obtained by inverting the logic level of the data strobe signal DQSc to the second transmission line L2. The output buffer circuit 22 includes a three-state buffer. The output buffer circuit 22 outputs a signal in response to a low-level enable signal BEN supplied from the interface circuit 13, and sets the output terminals to a high impedance in response to a high-level enable signal BEN.

The signal control circuit 16 includes a determination circuit 23 and an AND circuit 24. The determination circuit 23 receives the data strobe signal DQSb from the input buffer circuit 21 in the buffer circuit 15. The determination circuit 23 receives the termination control signal So from the interface circuit 13. The determination circuit 23 receives a setting signal Ss via the interface circuit 13 from a memory controller (not illustrated) included in the system circuit 12.

The terminating circuit 18 is activated based on the termination control signal So. The terminating circuit 18 may be activated in response to, for example, the high-level termination control signal So, and may be deactivated in response to the low-level termination control signal So. When the interface circuit 13 receives a read request Rr from the memory controller (not illustrated), the interface circuit 13 outputs the high-level termination control signal So. When the interface circuit 13 receives no read request Rr from the memory controller, the interface circuit 13 outputs the low-level termination control signal So.

The setting signal Ss indicates a number of data blocks to be read by the system circuit 12 from the memory 11. The memory 11 has a burst mode in which data is consecutively read by incrementing the address Ad based on a burst value. The read data are consecutively output based on the data strobe signal DQS. The burst value indicates the number of data blocks to be consecutively read. The setting signal Ss may correspond to the burst value in the determination circuit 23.

The determination circuit 23 outputs a permission signal Se in accordance with the data strobe signal DQS, the termination control signal So, or the setting signal Ss. When the termination control signal So is at the low-level (ODT OFF), such as when the system circuit 12 writes data to the memory 11, the determination circuit 23 may output the low-level (prohibition mode) permission signal Se. When the termination control signal So is at the high-level (ODT ON), the determination circuit 23 outputs the permission signal Se in accordance with the data strobe signal DQS or the setting signal Ss.

When the determination circuit 23 detects a transition of the data strobe signal DQSb from the high-level to the low-level, the determination circuit 23 outputs the high-level (permission mode) permission signal Se. The determination circuit 23 counts transitions of the data strobe signal DQSb. Transitions of the data strobe signal DQSb, such as the rising edges and the falling edges of the data strobe signal DQSb, may occur for the number of data blocks to be read from the memory 11, such as the burst value. When the counted value exceeds a value set based on the setting signal Ss, the determination circuit 23 outputs the low-level (prohibition mode) permission signal Se.

After the memory 11 outputs the data strobe signal DQS at the preamble, for example, at a low-level (the low-level strobe signal DQSa and the high-level inverted strobe signal BDQSa) for a certain time in response to a read request Rr from the system circuit 12, the memory 11 toggles the strobe signal DQSa or BDQSa, and outputs the data DQ. The determination circuit 23 outputs the high-level permission signal Se for a period from when a preamble is detected to when inputting of a certain number of data blocks DQ is completed.

The AND circuit 24 receives the data strobe signal DQSb from the buffer circuit 15 and the permission signal Se from the determination circuit 23. The AND circuit 24 outputs a data strobe signal DQSd to the interface circuit 13 in accordance with the data strobe signal DQSb and the permission signal Se. When the permission signal Se is at the high-level (permission mode), the AND circuit 24 outputs the data strobe signal DQSd at a level substantially equal to the level of the data strobe signal DQSb. The interface circuit 13 reads the data DQ based on the data strobe signal DQSd which toggles. When the permission signal Se is at the low-level (prohibition mode), the AND circuit 24 outputs the low-level data strobe signal DQSd. Since the data strobe signal DQSd does not toggle, the interface circuit 13 may not read the data DQ.

The termination control circuit 17 includes an AND circuit 25 and an inverter circuit 26. The termination control signal So is input from the interface circuit 13 to the AND circuit 25, and the permission signal Se is input from the determination circuit 23 to the AND circuit 25. The AND circuit 25 outputs an adjustment signal Sd1 in accordance with the termination control signal So and the permission signal Se. When the termination control signal So is at the high-level (ODT ON), the AND circuit 25 outputs the adjustment signal Sd1 at a level in accordance with the permission signal Se. The AND circuit 25 outputs the low-level adjustment signal Sd1 in response to the low-level termination control signal So. The inverter circuit 26 outputs an inverted adjustment signal BSd1 at a level obtained by inverting the logic level of the adjustment signal Sd1.

The terminating circuit 18 includes an inverter circuit 27 and first to fourth terminators 18a to 18d. The inverter circuit 27 outputs an inverted termination control signal BSo at a level obtained by inverting the logic level of the termination control signal So.

The first terminator 18a includes a P-channel MOS transistor T1, an N-channel MOS transistor T2, and first and second terminating resistors R1 and R2. The source of the first transistor T1 is coupled to a power supply line VLa for supplying a high potential voltage VDD. The drain of the first transistor T1 is coupled to a first terminal of the first terminating resistor R1. A second terminal of the first terminating resistor R1 is coupled to the first transmission line L1. The inverted termination control signal BSo is supplied to the gate of the first transistor T1.

The source of the second transistor T2 is coupled to a power supply line VLb for supplying a low potential voltage. The drain of the second transistor T2 is coupled to a first terminal of the second terminating resistor R2. A second terminal of the second terminating resistor R2 is coupled to the first transmission line L1. The termination control signal So is supplied to the gate of the second transistor T2. The low potential voltage may be 0 V, such as a ground level. The power supply line VLb illustrated in FIG. 3 may correspond to ground.

In ODT ON, the termination control signal So may be at the high-level and the inverted signal BSo may be at the low-level. Thus, the first transistor T1 and the second transistor T2 are turned ON. The transmission line L1 is coupled to the power supply line VLa via the first terminating resistor R1 and the first transistor T1, and is coupled to the power supply line VLb via the second terminating resistor R2 and the second transistor T2. The first terminator 18a terminates the first transmission line L1 by using the ON resistances of the first and second transistors T1 and T2 and combined resistances of the first and second terminating resistors R1 and R2.

In ODT OFF, the termination control signal So may be at the low-level, and the inverted signal BSo may be at the high-level. Thus, the first transistor T1 and the second transistor T2 are turned OFF. Because the first and second transistors T1 and T2 are turned OFF, the first and second terminating resistors R1 and R2 are decoupled from the power supply lines VLa and VLb. The first transmission line L1 may not be terminated. The first transmission line L1 is set to a high impedance.

The second terminator 18b includes first and second transistors T1 and T2 and first and second terminating resistors R1 and R2 similar to the first terminater 18a. The inverted termination control signal BSo is supplied to the gate of the first transistor T1. The first transistor T1 of the second terminator 18b is turned ON/OFF in phase with the first transistor T1 of the first terminator 18a, and the first terminating resistor R1 is coupled to or decoupled from the power supply line VLa. The adjustment signal Sd1 is supplied to the gate of the second transistor T2. The second terminating resistor R2 is coupled to or decoupled from the power supply line VLb based on the adjustment signal Sd1.

For example, in ODT ON and when the adjustment signal Sd1 is at the low-level, the second transistor T2 of the second terminator 18b is turned OFF. The first transmission line L1 is coupled to the power supply line VLa via the transistor T1 and the terminating resistor R1 of the first terminator 18a and the transistor T1 and the terminating resistor R1 of the second terminator 18b, and is coupled to the power supply line VLb via the transistor T2 and the terminating resistor R2 of the first terminator 18a. The first transmission line L1 is terminated by a combined resistance of elements between the power supply lines VLa and VLb. The first transmission line L1 may be driven to a level in accordance with the ratio between the combined resistances, such as the combined resistance on the side of the power supply line VLa and the combined resistance on the side of the power supply line VLb.

In ODT ON and when the adjustment signal Sd1 is at the high-level, the second transistor T2 of the second terminator 18b is turned ON. The first transmission line L1 is coupled to the power supply line VLa via the transistor T1 and the terminating resistor R1 of the first terminator 18a and the transistor T1 and the terminating resistor R1 of the second terminator 18b, and is coupled to the power supply line VLb via the transistor T2 and the terminating resistor R2 of the first terminator 18a and the transistor T2 and the terminating resistor R2 of the second terminator 18b. The first transmission line L1 is terminated by a combined resistance of elements between the power supply lines VLa and VLb. The combined resistance changes by an amount corresponding to the transistor T2 and the terminating resistor R2 of the second terminator 18b as compared with the combined resistance where the adjustment signal Sd1 is at the low-level. The resistance ratio of the terminating resistors for the first transmission line L1 is adjusted by the adjustment signal Sd1. The level where the first transmission line L1 is driven by the first and second terminators 18a and 18b becomes a level in accordance with the resistance ratio between the combined resistances, and is adjusted by the adjustment signal Sd1.

The third terminator 18c includes first and second transistors T1 and T2 and first and second terminating resistors R1 and R2 similar to the first terminator 18a. The inverted termination control signal BSo is supplied to the gate of the first transistor T1, and the termination control signal So is supplied to the gate of the second transistor T2. In ODT ON, the third terminator 18c terminates the second transmission line L2. In ODT OFF, the third terminator 18c sets the second transmission line L2 to a high impedance.

The fourth terminator 18d includes first and second transistors T1 and T2 and first and second terminating resistors R1 and R2 similar to the second terminator 18b. The inverted adjustment signal BSd1 is supplied to the gate of the first transistor T1. The first terminating resistor R1 is coupled to or decoupled from the power supply line VLa based on the inverted adjustment signal BSd1. The termination control signal So is supplied to the gate of the second transistor T2. The second transistor T2 of the fourth terminator 18d is turned ON/OFF in phase with the second transistor T2 of the third terminator 18c, and the second terminating resistor R2 is coupled to or decoupled from the power supply line VLb.

The second transmission line L2 is terminated by combined resistances of the third terminator 18c and the fourth terminator 18d based on the termination control signal So. The combined resistances of the third terminator 18c and the fourth terminator 18d are adjusted based on the inverted adjustment signal BSd1.

The level of the inverted adjustment signal BSd1 may be a level obtained by inverting the logic level of the adjustment signal Sd1. The adjustment signal Sd1 is supplied to the gate of the N-channel MOS transistor T2 of the second terminator 18b, and the inverted adjustment signal BSd1 is supplied to the gate of the P-channel MOS transistor T1 of the fourth terminator 18d. The transistor T2 of the second terminator 18b and the transistor T1 of the fourth terminator 18d are turned ON/OFF in substantially the same phase. The transistor T2 of the second terminator 18b is arranged between the power supply line VLb for supplying a low potential voltage and the first transmission line L1. The transistor T1 of the fourth terminator 18d is arranged between the power supply line VLa for supplying a high potential voltage and the second transmission line L2. An adjustment direction of the level at which the first transmission line L1 is driven and an adjustment direction of the level at which the second transmission line L2 is driven may be opposite to each other.

FIGS. 4A to 4C illustrate an exemplary operation of a terminating circuit. For example, the ON resistance value of each of the first and second transistors T1 and T2 may be 50Ω, and the resistance value of each of the first and second terminating resistors R1 and R2 may be 150Ω. When the termination control signal So is at the low-level (ODT OFF), the transistors T1 and T2 of the first and second terminators 18a and 18b are turned OFF. Thus, as illustrated at the top row of FIG. 4A, the resistance value of each of the first and second terminators 18a and 18b may correspond to an infinite resistance. As illustrated at the bottom row of FIG. 4A, the resistance value of each of the third and fourth terminators 18c and 18d may correspond to an infinite resistance. The first transmission line L1 and the second transmission line L2 are individually set to a high impedance.

When the termination control signal So is at the high-level (ODT ON) and when the adjustment signal Sd1 is at the low-level (the inverted adjustment signal BSd1 is at the high-level), the transistor T2 of the second terminator 18b is turned OFF. As illustrated at the top row of FIG. 4B, the resistance value of each of the first and second terminators 18a and 18b may correspond to a resistance value of 100Ω coupled between the first transmission line L1 and the power supply line VLa and a resistance value of 200Ω coupled between the first transmission line L1 and the power supply line VLb respectively. The high potential voltage VDD may be 1.8 V, and the level of the first transmission line L1, such as the data strobe signal DQSa, may be 1.2 V.

The transistor T1 of the fourth terminator 18d is turned OFF based on the high-level termination control signal So and the high-level inverted adjustment signal BSd1. As illustrated at the bottom row of FIG. 4B, the resistance value of each of the third and fourth terminators 18c and 18d may correspond to a resistance value of 200Ω coupled between the second transmission line L2 and the power supply line VLa and a resistance value of 100Ω coupled between the second transmission line L2 and the power supply line VLb respectively. The level of the second transmission line L2, such as the inverted data strobe signal BDQSa, may be 0.6 V.

When the termination control signal So is at the high-level (ODT ON) and when the adjustment signal Sd1 is at the high-level (the inverted adjustment signal BSd1 is at the low-level), the transistors T1 and T2 of the first and second terminators 18a and 18b may be turned ON. As illustrated at the top row of FIG. 4C, the resistance value of each of the first and second terminators 18a and 18b may correspond to a resistance value of 100Ω coupled between the first transmission line L1 and the power supply line VLa and a resistance value of 100Ω coupled between the first transmission line L1 and the power supply line VLb respectively. The level of the first transmission line L1, such as the data strobe signal DQSa, may be 0.9 V.

The transistors T1 and T2 of the third and fourth terminators 18c and 18d are turned ON based on the high-level termination control signal So and the low-level inverted adjustment signal BSd1. As illustrated at the bottom row of FIG. 4C, the resistance value of each of the third and fourth terminators 18c and 18d may correspond to a resistance value of 100Ω coupled between the second transmission line L2 and the power supply line VLa and a resistance value of 100Ω coupled between the second transmission line L2 and the power supply line VLb respectively. The level of the second transmission line L2, such as the inverted data strobe signal BDQSa, may be 0.9 V.

FIG. 5 illustrates an exemplary operation of the input/output circuit. The input/output circuit illustrated in FIG. 3 may perform the operation illustrated in FIG. 5.

Since, as illustrated in FIG. 5, the state is, for example, a postamble state at time t0 and the first and second transmission lines L1 and L2 are not driven, the first and second transmission lines L1 and L2 are set to a high impedance. This state may correspond to a state subsequent to a write postamble state after a write operation where data is written from the system circuit 12 to the memory 11 or may correspond to a state subsequent to a read postamble state after a read operation. Since the termination control signal So is at the low-level (ODT OFF), the first and second transmission lines L1 and L2 are not terminated by the first to fourth terminators 18a to 18d.

At time t1, the interface circuit 13 outputs the high-level termination control signal So (ODT ON) in response to a read request Rr from the memory controller (not illustrated). Since the permission signal Se is at the low-level, the first transmission line L1 is terminated by the combined resistances illustrated at the top row of FIG. 4B. The voltage of the first transmission line L1 (data strobe signal DQSa) increases and reaches a voltage determined in accordance with the ratio between the combined resistances, for example, 1.2 V. The second transmission line L2 is terminated by the combined resistances illustrated at the bottom row of FIG. 4B. The voltage of the second transmission line L2 (inverted data strobe signal BDQSa) decreases and reaches a voltage determined in accordance with the ratio between the combined resistances, for example, 0.6 V.

Because the differential voltage between the data strobe signal DQSa and the inverted data strobe signal BDQSa exceeds the positive-side threshold voltage, for example, 0.5 V, the input buffer circuit 21 outputs the high-level data strobe signal DQSb at time t2.

The memory 11 outputs a preamble to the transmission lines L1 and L2 in response to a read request Rr from the system circuit 12. For example, the memory 11 outputs the low-level data strobe signal DQSa and the high-level inverted data strobe signal BDQSa. When the differential voltage (VDQSa-VBDQSa) between the data strobe signal DQSa and the inverted data strobe signal BDQSa falls below the negative-side threshed voltage, for example, -0.5 V, the input buffer circuit 21 outputs the low-level data strobe signal DQSb at time t3.

Since the termination control signal So is at the high-level, the determination circuit 23 outputs the high-level (permission mode) permission signal Se in response to the low-level data strobe signal DQSb at time t4. The AND circuit 24 outputs the data strobe signal DQSd at a level substantially equal to the data strobe signal DQSb in response to the high-level (permission mode) permission signal Se.

After the preamble, the memory 11 outputs the data strobe signals DQSa and BDQSa which toggles. Based on the data strobe signals DQSa and BDQSa, the input buffer circuit 21 outputs the data strobe signal DQSb which toggles. The AND circuit 24 outputs the data strobe signal DQSd at a level substantially equal to the data strobe signal DQSb. The interface circuit 13 reads the data DQ based on the data strobe signal DQSd which toggles.

When the high-level permission signal Se is output from the determination circuit 23 at time t4, the termination control circuit 17 outputs the high-level adjustment signal Sd1 and the low-level inverted adjustment signal BSd1 in response to the high-level permission signal Se. The terminating circuit 18 may operate as an equivalent circuit illustrated in FIG. 4C. The transmission line L1 enters a state where a terminating resistor having the same resistance is coupled between the first transmission line L1 and the power supply line VLa for supplying a high voltage and between the first transmission line L1 and the power supply line VLb for supplying a low voltage. Based on the ratio between the combined resistances of the first and second terminators 18a and 18b, the transmission line L1 may be driven to a middle voltage of a power supply voltage range set in accordance with the high voltage and the low voltage, for example, VDD/2.

A transition time (fall time) from a high voltage level (high-level) to a low voltage level (low-level) may be substantially equal to a transition time (rise time) from the low-level to the high-level. For example, symmetry for transmitting the data strobe signal DQSa may be ensured.

The resistance of each of the combined resistances for terminating the first transmission line L1 may be 100Ω. Since the impedance based on the combined resistances is calculated as a resistance where two combined resistances are coupled in parallel, the impedance may be 50Ω. Because the impedance of the first and second terminators 18a and 18b matches the characteristic impedance of the first transmission line L1, reflection of the data strobe signal DQSa transmitted via the first transmission line L1 may be reduced, and signal wave distortion due to the reflection may be reduced.

Similar to the first transmission line L1, the second transmission line L2 is terminated by the combined resistances of the third and fourth terminators 18c and 18d and is driven to the middle level (VDD/2) of the power supply voltage range. Thus, symmetry for transmitting the inverted data strobe signal BDQSa may be ensured. Because the combined resistances of the third and fourth terminators 18c and 18d match the characteristic impedance of the second transmission line L2, reflection of the inverted data strobe signal BDQSa transmitted via the second transmission line L2 may be reduced, and signal wave distortion due to the reflection may be reduced.

When the system circuit 12 outputs a read request Rr to the memory 11, the interface circuit 13 activates the terminating circuit 18 for the transmission lines L1 and L2 based on the termination control signal So. Based on the termination control signal So, and the permission signal Se output from the determination circuit 23, the termination control circuit 17 adjusts the resistance of the terminating circuit 18 to a level where the input buffer circuit 21 detects the levels of the transmission lines L1 and L2 as high-level signals.

The input buffer circuit 21 outputs the high-level data strobe signal DQSb and, outputs the low-level data strobe signal DQSb based on a preamble output from the memory 11 (low-level data strobe signal DQSa).

Because the data strobe signal DQSb output from the input buffer circuit 21 changes from the high-level to the low-level, the determination circuit 23 detects the low-level data strobe signal DQSa, for example, a preamble. In the system circuit 12, the termination control circuit 17 for adjusting the resistance of each terminating resistor may be provided, and no preamble detection circuit may be provided.

When the determination circuit 23 detects the low-level data strobe signal DQSb, for example, a preamble, the determination circuit 23 outputs the high-level permission signal Se. In response to the permission signal Se, the termination control circuit 17 adjusts the resistance of the terminating circuit 18 so that the levels of the first and second transmission lines L1 and L2 may become a middle voltage of the high potential voltage VDD.

Because the transition time (fall time) from the high-level to the low-level of the complementary data strobe signals DQSa and BDQSa is substantially equal to the transition time (rise time) from the low-level to the high-level, symmetry for transmitting the data strobe signal DQSa may be ensured.

Figure 6:
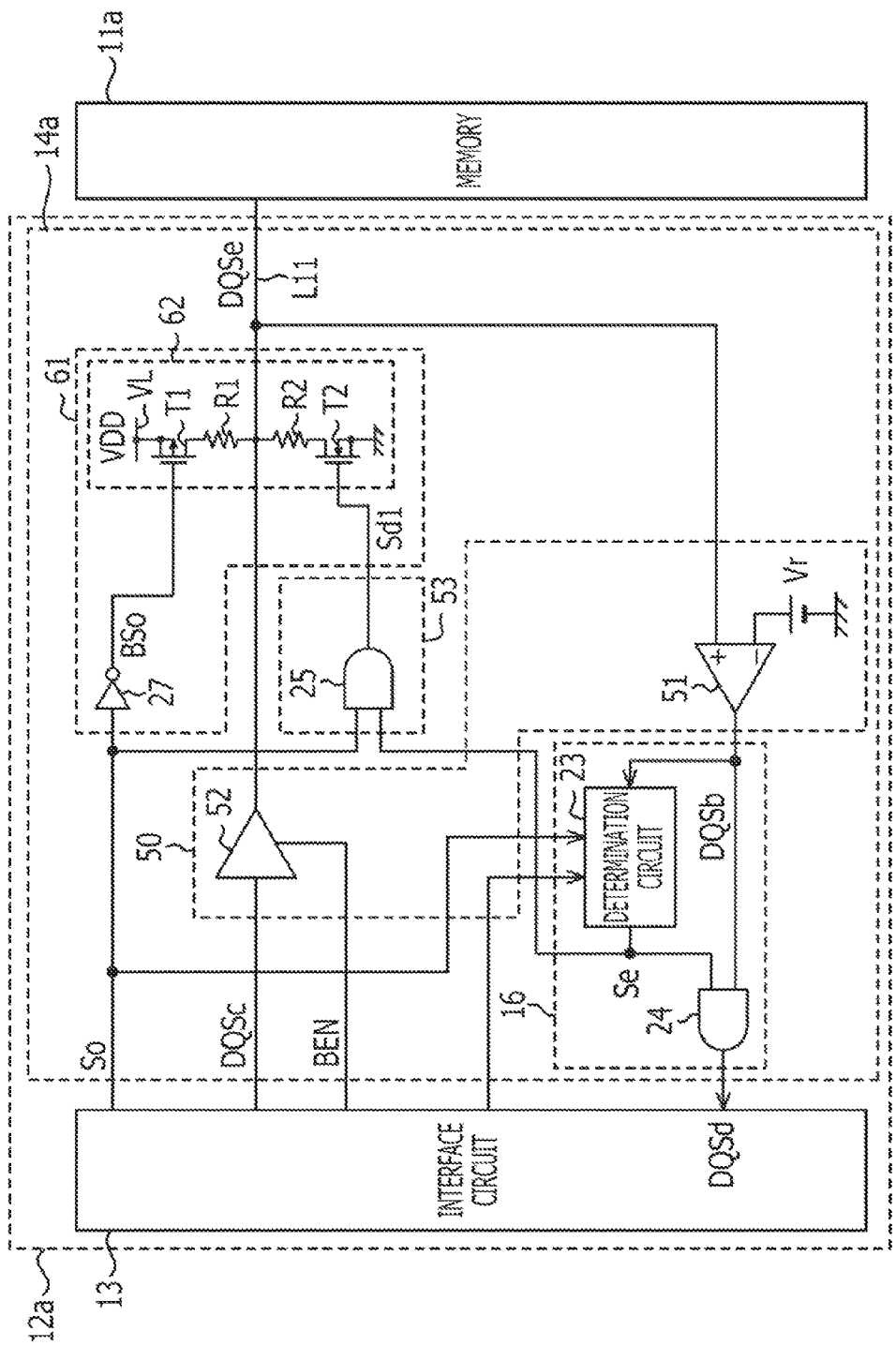
FIG. 6 illustrates an exemplary input/output circuit.
Figure 7A:
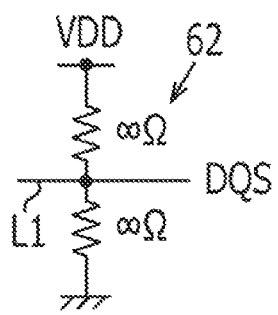
FIGS. 7A to 7C illustrate an exemplary operation of a terminating circuit.
Figure 7B:
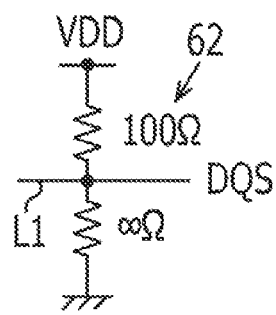
Figure 7C:
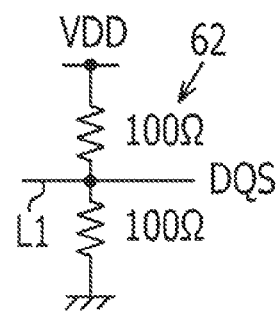
Figure 8:
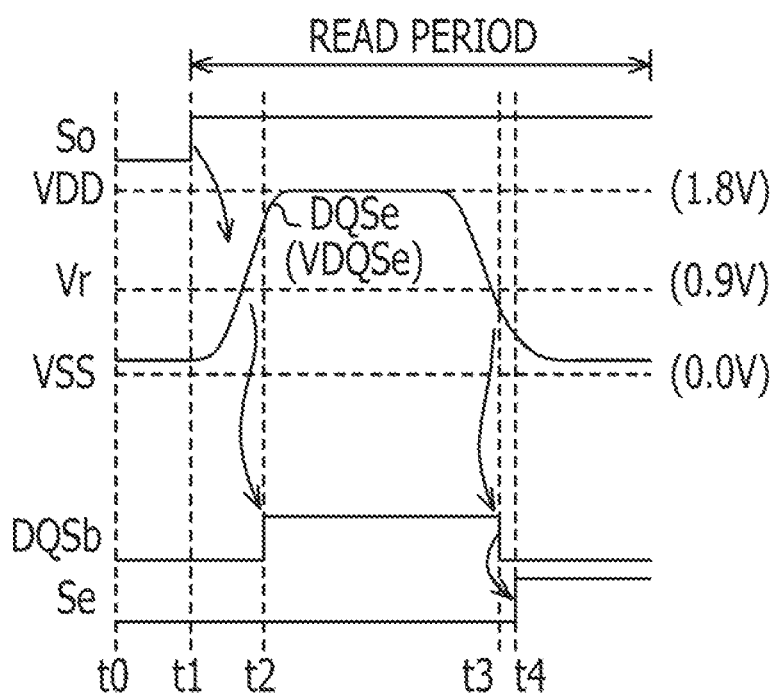
FIG. 8 illustrates an exemplary operation of an input/output circuit.

In FIGS. 6 to 8, elements that are substantially the same as or similar to those illustrated in FIGS. 2 to 5 are given the same reference symbols, and descriptions thereof may be omitted or reduced.

FIG. 6 illustrates an exemplary input/output circuit. A system circuit 12a and a memory 11a are coupled to each other via a transmission line L11 and transmit and receive a single-end data strobe signal DQSe to and from each other.

The system circuit 12a includes the interface circuit 13, an input/output unit 14a, and a memory controller (not illustrated). The input/output unit 14a includes the signal control circuit 16, a buffer circuit 50, a termination control circuit 53, and a terminating circuit 61.

The buffer circuit 50 includes an input buffer circuit 51 and an output buffer circuit 52. The data strobe signal DQSe, which corresponds to a single-end signal, is input from the memory 11a to the input buffer circuit 51 via the transmission line L11. The input buffer circuit 51 outputs the data strobe signal DQSb to the signal control circuit 16 in accordance with the differential voltage (=VDQSe−Vr) between the voltage VDQSe of the data strobe signal DQSe and a reference voltage Vr.

The input buffer circuit 51 outputs the high-level data strobe signal DQSb when the differential voltage exceeds the positive-side threshold voltage and outputs the low-level data strobe signal DQSb when the differential voltage falls below the negative-side threshold voltage. For example, the reference voltage Vr may be set to ½ of the power supply voltage range, for example, 0.9V. The positive-side threshold voltage may be set to 0.3V. The negative-side threshold voltage may be set to −0.3 V.

The data strobe signal DQSc from the interface circuit 13 is input to the output buffer circuit 52. The output buffer circuit 52 generates the data strobe signal DQSe corresponding to a single-end signal based on the data strobe signal DQSc, and outputs the data strobe signal DQSe to the memory 11a via the transmission line L11. The output buffer circuit 52 may include a three-state buffer. The output buffer circuit 52 sets an output terminal to a high impedance in response to the high-level enable signal BEN supplied from the interface circuit 13.

The termination control circuit 53 includes the AND circuit 25. The AND circuit 25 outputs the adjustment signal Sd1 based on the termination control signal So and the permission signal Se. The terminating circuit 61 includes the inverter circuit 27 and a terminator 62. The inverter circuit 27 outputs the inverted termination control signal BSo generated by inverting the logic level of the termination control signal So. The configuration of the terminator 62 may be substantially the same as or similar to the configuration of the second terminator 18b illustrated in FIG. 3. The terminator 62 includes a P-channel MOS transistor T1, an N-channel MOS transistor T2, and first and second terminating resistors R1 and R2. The source of the first transistor T1 is coupled to the power supply line VLa for supplying the high potential voltage VDD. The drain of the first transistor T1 is coupled to a first terminal of the first terminating resistor R1. A second terminal of the terminating resistor R1 is coupled to the transmission line L11. The transmission line L11 is coupled to a first terminal of the second terminating resistor R2. A second terminal of the resistor R2 is coupled to the drain of the second transistor T2. The source of the second transistor T2 is coupled to the power supply line VLb for supplying a low potential voltage, for example, ground. The inverted termination control signal BSo is supplied to the gate of the first transistor T1. The adjustment signal Sd1 is supplied to the gate of the second transistor T2.

FIGS. 7A to 7C illustrate an exemplary operation of a terminating circuit 61. When the termination control signal So is at the low-level (ODT OFF), the transistor T1 is turned OFF based on the high-level inverted termination control signal BSo, and the transistor T2 is turned OFF based on the low-level adjustment signal Sd1. The transmission line L11 may not be terminated. Since the terminator 62 has an infinite resistance, as illustrated in FIG. 7A, the transmission line L11 is set to a high impedance.

When the termination control signal So is at the high-level (ODT ON), the transistor T1 is turned ON based on the low-level inverted termination control signal BSo. When the adjustment signal Sd1 is at the low-level, the transistor T2 is turned OFF. At this time, the transmission line L11 is coupled to the power supply line VLa via the ON-resistance of the transistor T1 and the combined resistance of the first terminating resistor R1. Since the transistor T2 is turned OFF, the combined resistance between the transmission line L11 and the power supply line VLb may be infinite.

For example, the ON-resistance of each of the first and second transistors T1 and T2 may be 25Ω, and the resistance of each of the first and second terminating resistors R1 and R2 may be 75Ω. As illustrated in FIG. 7B, the terminator 62 corresponds to a resistance of 100Ω coupled between the transmission line L11 and the power supply line VLa and a resistance of an infinite resistance coupled between the transmission line L11 and the power supply line VLb. The transmission line L11 is driven to the level of the power supply line VLa, for example, the high voltage VDD level (high-level).

When the termination control signal So is at the high-level (ODT ON), the transistor T1 is turned ON based on the low-level inverted termination control signal BSo. When the adjustment signal Sd1 is at the high-level, the transistor T2 is turned ON. The transmission line L11 is coupled to the power supply line VLa via the ON-resistance of the transistor T1 and the combined resistance of the second terminating resistor R1. The transmission line L11 is coupled to the power supply line VLb via the ON-resistance of the transistor T2 and the combined resistance of the second terminating resistor R2. As illustrated in FIG. 7C, the terminator 62 corresponds to a resistance of 100Ω coupled between the transmission line L11 and the power supply line VLa and a resistance of 100Ω coupled between the transmission line L11 and the power supply line VLb. The transmission line L11 is driven to a middle level between the two power supply lines VLa and VLb, for example, ½ of the high voltage VDD level (=VDD/2).

FIG. 8 illustrates an exemplary operation of a input/output circuit. The input/output circuit illustrated in FIG. 6 may perform the operation illustrated in FIG. 8.

For example, because the transmission line L11 is not driven by the memory 11a and the system circuit 12a in a postamble state at time t0, the transmission line L11 may be set to a high impedance. Because the termination control signal So is at the low-level (ODT OFF), the transmission line L11 is not terminated by the terminator 62.

At time t1, the interface circuit 13 outputs the high-level termination control signal So (ODT ON) in response to a read request Rr from the memory controller (not illustrated). Since the permission signal Se is at the low-level, as illustrated in FIG. 7B, the transmission line L11 is terminated by the terminating resistor on the high voltage side. The voltage of the transmission line L11, for example, the voltage of the data strobe signal DQSe, increases to a high voltage level (high-level). Because the differential voltage between the voltage of the data strobe signal DQSe and the reference voltage Vr exceeds the positive-side threshold voltage, for example, 0.3V, at time t2, the input buffer circuit 51 outputs the high-level data strobe signal DQSb.

The memory 11a outputs the low-level data strobe signal DQSe (preamble) in response to the read request Rr from the system circuit 12a. When the differential voltage (VDQSe−Vr) between the voltage of the data strobe signal DQSe and the reference voltage Vr falls below the negative-side threshold voltage (−0.3 V), at time t3, the input buffer circuit 51 outputs the low-level data strobe signal DQSb.

Since the termination control signal So is at the high-level, the determination circuit 23 outputs the high-level (permission mode) permission signal Se in response to the low-level data strobe signal DQSb at time t4. In response to the high-level permission signal Se, the AND circuit 24 outputs the data strobe signal DQSd at a level substantially equal to the data strobe signal DQSb.

After the preamble, the memory 11a outputs the data strobe signal DQSe which toggles. The input buffer circuit 21 outputs the data strobe signal DQSb which toggles based on the data strobe signal DQSe. The AND circuit 24 outputs the data strobe signal DQSd at a level substantially equal to the data strobe signal DQSb. The interface circuit 13 reads the data DQ based on the data strobe signal DQSd which toggles.

When the high-level permission signal Se is output from the determination circuit 23 at time t4, the termination control circuit 53 outputs the high-level adjustment signal Sd1 in response to the permission signal Se. Because the transistor T2 is turned ON, the terminator 62 terminates the transmission line L11 to the power supply line VLa and the power supply line VLb by using the combined resistance, as illustrated in FIG. 7C. The drive level of the transmission line by the terminator 62 is a middle level of the power supply voltage range, for example, ½ of the high voltage VDD.

When the system circuit 12a outputs a read request Rr to the memory 11a and changs to a preamble state, the system circuit 12a outputs a read request Rr and sets the voltage of the transmission line L11, for example, the voltage of the data strobe signal DQSe, to 1.8 V. When the system circuit 12a outputs a read request Rr to the memory 11a, the differential voltage (=VDQSe−Vr) between the data strobe signal DQSe and the reference voltage Vr may be, for example, 0.9 V, which is a voltage exceeding the positive-side threshed voltage, for example, 0.3 V, of the input buffer circuit 51. Prior to receiving a preamble state, for example, the low-level data strobe signal DQSb, from the memory 11a, the input buffer circuit 51 outputs the high-level data strobe signal DQSb and then outputs the low-level data strobe signal DQSb.

Subsequent to the high-level data strobe signal DQSb output from the input buffer circuit 51, the determination circuit 23 receives the low-level (preamble state) data strobe signal DQSb, and may detect a transition to a preamble state based on the falling from the high-level to the low-level of the data strobe signal DQSb.

When the system circuit 12a outputs a read request Rr to the memory 11a, the interface circuit 13 activates the terminating circuit 61 corresponding to the transmission line L11 based on the termination control signal So. Based on the termination control signal So, and the permission signal Se output from the determination circuit 23, the termination control circuit 53 adjusts the resistance of the terminating circuit 61 to a value where the input buffer circuit 51 detects the level of the transmission line L11 as a high-level signal.

The input buffer circuit 51 outputs the high-level data strobe signal DQSb and, outputs the low-level data strobe signal DQSb based on a signal indicating a preamble output from the memory 11a, for example, the low-level data strobe signal DQSe.

Because the data strobe signal DQSb output from the input buffer circuit 51 changes from the high-level to the low-level, the determination circuit 23 may detect the low-level data strobe signal DQSe, for example, a preamble. The system circuit 12a includes the termination control circuit 53 for adjusting the resistance of each terminating resistor and may not include a preamble detection circuit.

When the determination circuit 23 detects the low-level data strobe signal DQSb, for example, a preamble, the determination circuit 23 outputs the high-level permission signal Se. In response to the permission signal Se, the termination control circuit 53 adjusts the resistance of the terminating circuit 61 so that the level of the transmission line L11 may become a middle voltage of the high voltage VDD.

Delay of a logic transition of the single-end data strobe signal DQSe may be reduced. For example, the transition time (fall time) from the high-level to the low-level becomes substantially equal to the transition time (rise time) from the low-level to the high-level, and hence, symmetry for transmitting the data strobe signal DQSe may be maintained.

Figure 9:
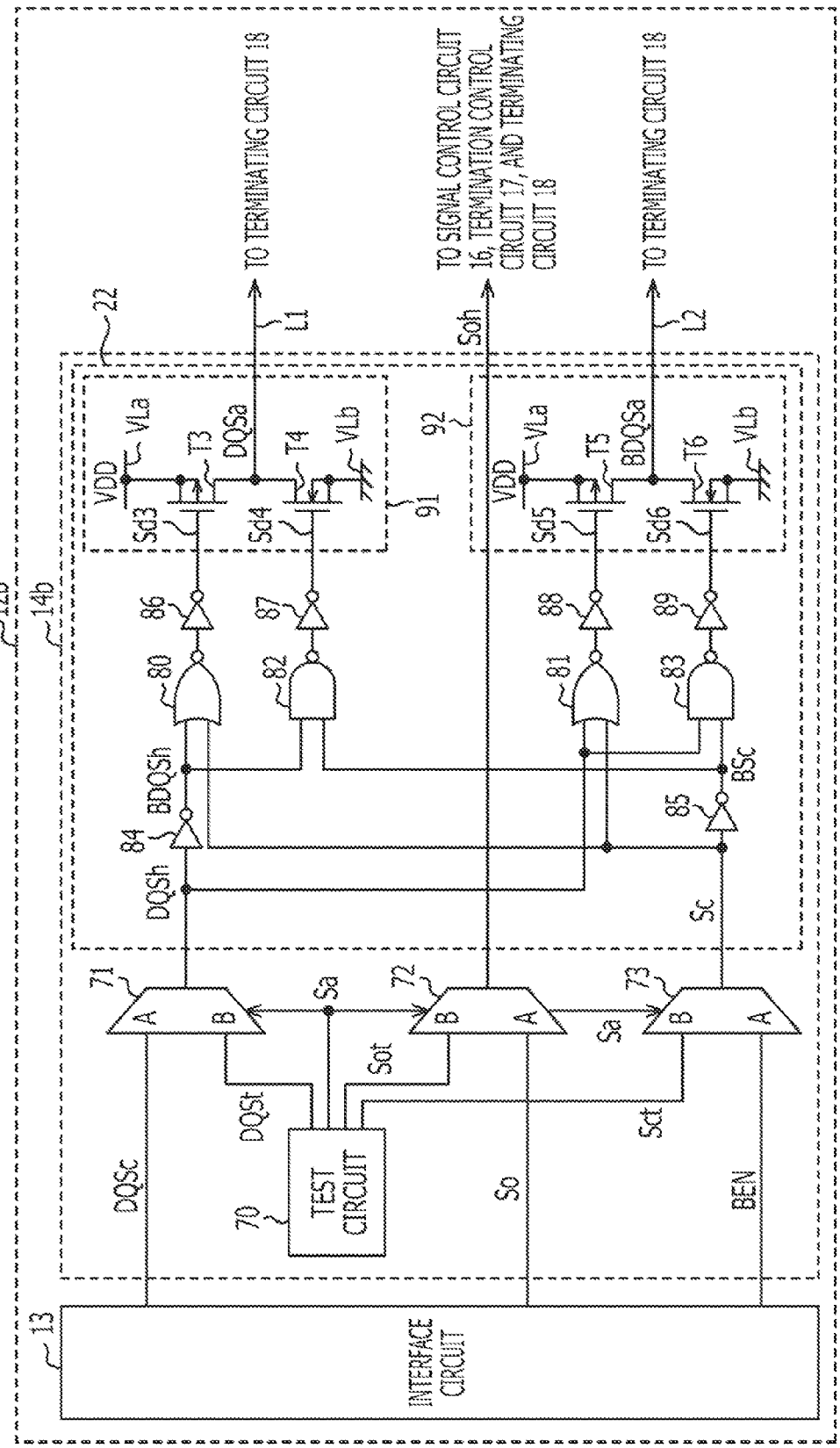
FIG. 9 illustrates an exemplary output control circuit.
Figure 10:
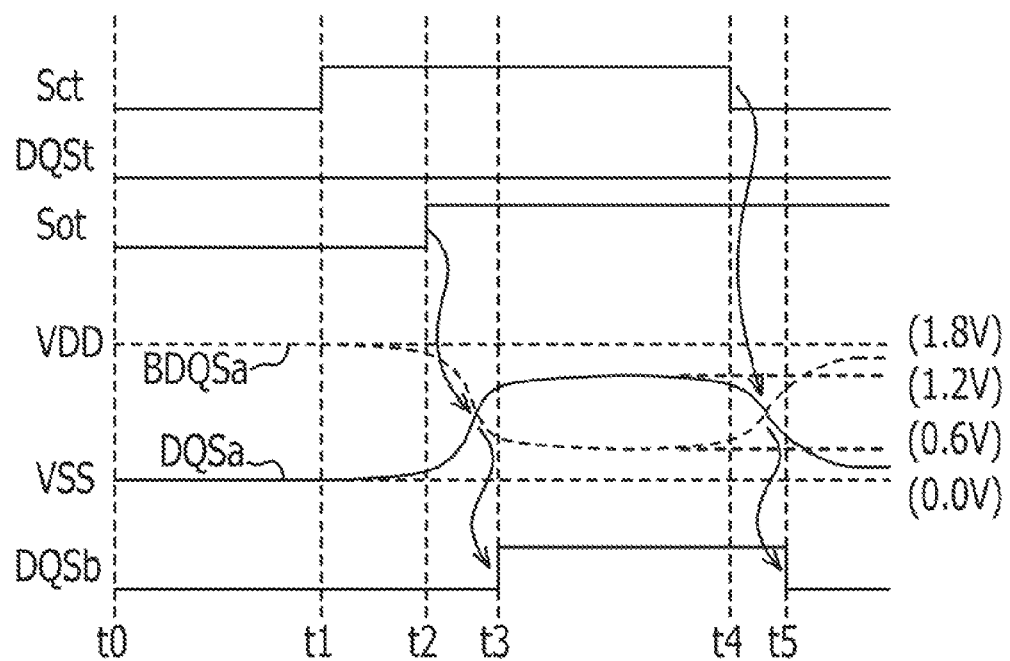
FIG. 10 illustrates an exemplary operation of an output control circuit.

In FIGS. 9 and 10, elements that are substantially the same as or similar to those illustrated in FIGS. 2 to 8 are given the same reference symbols, and descriptions thereof may be omitted or reduced.

FIG. 9 illustrates an exemplary output control circuit. A system circuit 12b illustrated in FIG. 9 includes the interface circuit 13, an input/output unit 14b, and a memory controller (not illustrated). The input/output unit 14b includes the elements included in the input/output circuit 14 illustrated in FIG. 3, a test circuit 70, and first to third selecting circuits 71 to 73.

The test circuit 70 receives a test start signal from a tester (not illustrated) and, based on a test pattern, outputs a test data strobe signal DQSt, a test termination control signal Sot, a test control signal Sct, and a selection signal Sa for selecting one of the test signals DQSt, Sot, and Sct.

Based on the selection signal Sa, the first selecting circuit 71 selects the data strobe signal DQSc output from the interface circuit 13 in a normal operation, and selects the test signal DQSt output from the test circuit 70 in a test operation. The first selecting circuit 71 outputs a data strobe signal DQSh at a level substantially equal to the level of the selected signal.

Based on the selection signal Sa, the second selecting circuit 72 selects the termination control signal So output from the interface circuit 13 in a normal operation, and selects the test signal Sot output from the test circuit 70 in a test operation. The second selecting circuit 72 outputs a termination control signal Soh at a level substantially equal to the level of the selected signal. The signal control circuit 16, the termination control circuit 17, and the terminating circuit 18 may operate based on the termination control signal Soh.

Based on the selection signal Sa, the third selecting circuit 73 selects the enable signal BEN output from the interface circuit 13 in a normal operatrion, and selects the test signal Sct output from the test circuit 70 in a test oprtation. The third selecting circuit 73 outputs an enable signal Sc at a level substantially equal to the level of the selected signal.

The output buffer circuit 22 includes NOR circuits 80 and 81, NAND circuits 82 and 83, inverter circuits 84 to 89, and output units 91 and 92. The inverter circuit 84 outputs an inverted data strobe signal BDQSh generated by inverting the data strobe signal DQSh from the first selecting circuit 71. The inverter circuit 85 outputs an inverted enable signal BSc generated by inverting the enable signal Sc.

The first NOR circuit 80 outputs a signal at a level in accordance with the result of a NOR operation performed on the inverted data strobe signal BDQSh and the enable signal Sc. The inverter circuit 86 outputs a drive signal Sd3 at a level obtained by inverting the logic level of the output signal of the NOR circuit 80. The first NAND circuit 82 outputs a signal at a level in accordance with the result of a NAND operation performed on the inverted data strobe signal BDQSh and the inverted enable signal BSc. The inverter circuit 87 outputs a drive signal Sd4 at a level obtained by inverting the logic level of the output signal of the NAND circuit 82.

The second NOR circuit 81 outputs a signal at a level in accordance with the result of a NOR operation performed on the data strobe signal DQSh and the enable signal Sc. The inverter circuit 88 outputs a drive signal Sd5 at a level obtained by inverting the logic level of the output signal of the NOR circuit 81. The second NAND circuit 83 outputs a signal at a level in accordance with the result of a NAND operation performed on the data strobe signal DQSh and the inverted enable signal BSc. The inverter circuit 89 outputs a drive signal Sd6 at a level obtained by inverting the logic level of the output signal of the NAND circuit 83.

The first output unit 91 includes a P-channel MOS transistor T3 and an N-channel MOS transistor T4. The source of the first transistor T3 is coupled to the power supply line VLa, and the drain of the transistor T3 is coupled to the first transmission line L1. The drive signal Sd3 is supplied to the gate of the transistor T3. The source of the second transistor T4 is coupled to the power supply line VLb, and the drain of the transistor T4 is coupled to the first transmission line L1. The drive signal Sd4 is supplied to the gate of the transistor T4.

The first output unit 91 outputs the low-level data strobe signal DQSa to the transmission line L1 based on the high-level drive signals Sd3 and Sd4. The first output unit 91 outputs the high-level data strobe signal DQSa to the transmission line L1 based on the low-level drive signals Sd3 and Sd4. The first output unit 91 sets the transmission line L1 to a high impedance based on the high-level drive signal Sd3 and the low-level drive signal Sd4.

The second output unit 92 includes a P-channel MOS transistor T5 and an N-channel MOS transistor T6. The source of the first transistor T5 is coupled to the power supply line VLa, and the drain of the transistor T5 is coupled to the second transmission line L2. The drive signal Sd5 is supplied to the gate of the transistor T5. The source of the second transistor T6 is coupled to the power supply line VLb, and the drain of the transistor T6 is coupled to the second transmission line L2. The drive signal Sd6 is supplied to the gate of the transistor T6.

The second output unit 92 outputs the low-level inverted data strobe signal BDQSa to the transmission line L2 based on the high-level drive signals Sd5 and Sd6. The second output unit 92 outputs the high-level inverted data strobe signal BDQSa to the transmission line L2 based on the low-level drive signals Sd5 and Sd6. The second output unit 92 sets the transmission line L2 to a high impedance based on the high-level drive signal Sd5 and the low-level drive signal Sd6.

FIG. 10 illustrates an exemplary operation of an output control circuit. The output control circuit illustrated in FIG. 9 may perform the operation illustrated in FIG. 10. At time t0, a test start signal is input from the tester (not illustrated) to the test circuit 70. The test circuit 70 outputs the high-level selection signal Sa to the first to third selecting circuits 71 to 73. Upon receipt of the high-level selection signal Sa, the first selecting circuit 71 outputs the data strobe signal DQSh at a level substantially equal to the test data strobe signal DQSt from the test circuit 70. The second selecting circuit 72 outputs the termination control signal Soh at a level substantially equal to the test termination control signal Sot. The third selecting circuit 73 outputs the enable signal Sc at a level substantially equal to the test control signal Sct. The test circuit 70 outputs the low-level (output mode) test control signal Sct and the low-level test data strobe signal DQSt. The low-level data strobe signal DQSa is output from the first output unit 91, and the high-level inverted data strobe signal BDQSa is output from the second output unit 92.

At time t1, the test circuit 70 outputs the high-level test control signal Sct. The output buffer circuit 22 sets the first output unit 91 and the second output unit 92 to a high impedance.

At time t2, the test circuit 70 outputs the high-level (ODT ON) test termination control signal Sot. As illustrated in FIG. 4B, the terminating circuit 18 may terminate the first transmission line L1 using a terminating resistance of 100Ω at the power supply side and a terminating resistance of 200Ω at the ground side. As illustrated in FIG. 4B, the terminating circuit 18 may terminate the second transmission line L2 using a terminating resistance of 200Ω at the power supply side and a terminating resistance of 100Ω at the ground side. The data strobe signal DQSa may be 1.2V. The inverted data strobe signal BDQSa may be 0.6V. At time t3, the differential voltage between the two signals DQSa and BDQSa exceeds the positive-side threshold voltage. Thus, the input buffer circuit 21 outputs the high-level data strobe signal DQSb.

At time t4, the test circuit 70 outputs the low-level test control signal Sct. The low-level data strobe signal DQSa is output from the first output unit 91, and the high-level inverted data strobe signal BDQSa is output from the second output unit 92. The signals DQSa and BDQSa may be substantially equal to a preamble output from the memory 11.

At time t5, the differential voltage between the two signals DQSa and BDQSa falls below the negative-side threshold voltage. Thus, the input buffer circuit 21 outputs the low-level data strobe signal DQSb.

The test circuit 70 included in the system circuit 12b generates the test signals DQSt, Sot, and Sct at the time of testing. Based on the signals DQSt, Sot, and Sct, the output buffer circuit 22 in the system circuit 12b generates, for example, a preamble that sets the first transmission line L1 to the low-level. The system circuit 12b, which is not coupled to the memory 11, checks the operation of the input/output unit 14b. This is applicable to a semiconductor device that includes the system circuit 12b and the memory 11, which are arranged in a single package, and do not determine the levels of the transmission lines L1 and L2.

Figure 11:
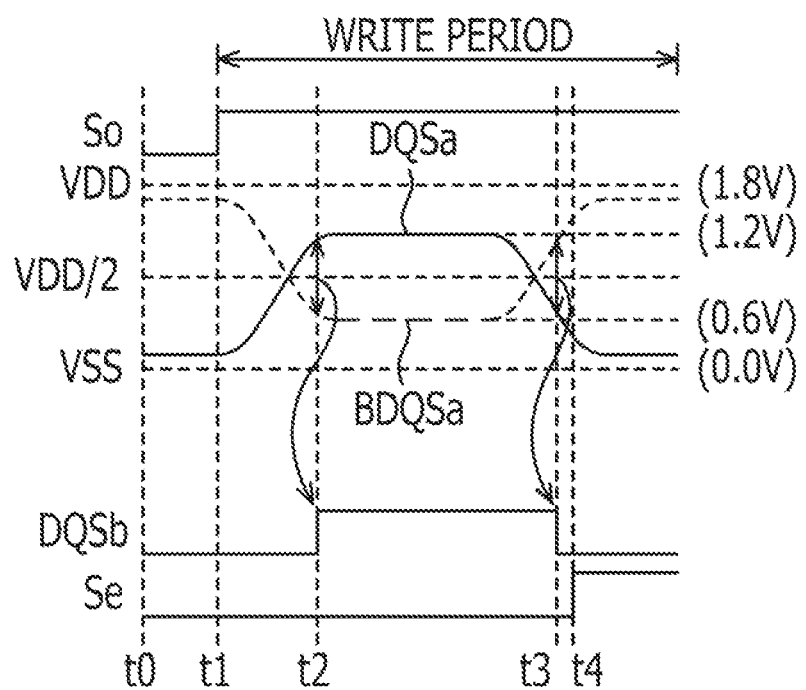
FIG. 11 illustrates an exemplary operation of an input/output circuit.

The system circuit 12 detects a preamble. The memory 11 may detect a write preamble output when the system circuit 12 writes the data DQ to the memory 11. For example, as illustrated in FIG. 11, the memory 11 may adjust, similar to the system circuit 12, the resistances of terminating resistors that terminate the first and second transmission lines L1 and L2 so that the level of the transmission lines L1 and L2 change from the high level to the low-level and from the low level to the high-level respectively. A preamble may be certainly detected, and a preamble may be detected by a simple circuit.

The power supply voltage and the resistances of the terminating resistors may be changed as needed. When a preamble is detected, the voltage of one of the first transmission line L1 and the second transmission line L2 may be changed. For example, the resistance ratio of the terminating circuit coupled to the first transmission line L1 or the terminating circuit coupled to the second transmission line L2 may be adjusted.

In FIG. 3, the fourth terminator 18d may be omitted. The input buffer circuit 21 may determine the data strobe signal DQSa based on the level difference between the two transmission lines L1 and L2.

For example, the drive level of the transmission line L1 is set to the middle level of the power supply voltage range by turning ON the transistor T2 of the second terminator 18b illustrated in FIG. 3. The drive level of a transmission line may be set to the middle level of the power supply voltage range by turning OFF a transistor.

The termination control circuit 17 sets the voltage of the data strobe signal DQSa to, for example, 0.9V by terminating the first transmission line L1 using the first and second terminating resistors R1 and R2 of the first and second terminators 18a and 18b. The termination control circuit 17 cuts off the first transmission line L1 and the second terminating resistors R2 of the second terminator 18b, thereby setting the voltage of the data strobe signal DQSa to, for example, 1.2V.

The termination control circuit 17 may set the voltage of the data strobe signal DQSa to, for example, 0.9V by terminating the first transmission line L1 using the first and second terminating resistors R1 and R2 of the first terminator 18a. The termination control circuit 17 may set the voltage of the data strobe signal DQSa to, for example, 1.2V by terminating the first transmission line L1 using the first terminating resistor R1 of the second terminator 18b.

The test circuit 70 generates the test data strobe signal DQSt, the test termination control signal Sot, and the test control signal Sct based on a preset test pattern. The test data strobe signal DQSt, the test termination control signal Sot, and the test control signal Sct may be generated by, for example, a tester or a central processing unit (CPU).

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions has been described in detail, it should be understood that the various changes, substitutions, and alterations could be made hereto without departing from the spirit and scope of the invention.

What is claimed is:

1. A receiving circuit comprising:
    a terminating resistor to set a terminating level of a transmission line for transmitting a reception signal including a signal having a first level indicating a preamble;
    a detection circuit to detect whether a level of the transmission line is the first level or a second level; and
    an adjustment circuit to adjust a resistance of the terminating resistor,
    the adjustment circuit adjusting the resistance of the terminating resistor to a value such that the detection circuit detects the level of the transmission line as the second level when a data request is output to a transmitting side.

2. The receiving circuit according to claim 1, wherein the adjustment circuit adjusts the resistance of the terminating resistor so as to set the level of the transmission line to a substantial middle of a power supply voltage range when the detection circuit detects the first level.

3. The receiving circuit according to claim 1, wherein the transmission line includes two-way transmission and reception.

4. The receiving circuit according to claim 1, wherein the data request includes a read request output to a memory coupled to the receiving circuit via the transmission line.

5. The receiving circuit according to claim 1, wherein the reception signal includes a data strobe signal output from a memory.

6. The receiving circuit according to claim 1, wherein the terminating resistor includes a first terminating resistor arranged between the transmission line and a first power supply line and a second terminating resistor arranged between the transmission line and a second power supply line, and
   wherein the adjustment circuit adjusts a ratio between a resistance of the first terminating resistor and a resistance of the second terminating resistor.

7. The receiving circuit according to claim 1, wherein the reception signal includes a differential signal, and
    wherein the transmission line includes a first transmission line and a second transmission line for the differential signal.

8. The receiving circuit according to claim 7, wherein the terminating resistor includes a first terminating resistor and a second terminating resistor for respectively setting driving levels of the first transmission line and the second transmission line,
    wherein the detection circuit detects a level difference between the first transmission line and the second transmission line, and
    wherein the adjustment circuit adjusts resistances of the first terminating resistor and the second terminating resistor to values such that the detection circuit detects the level difference as the second level.

9. A method for controlling a receiving circuit, the method comprising:
    setting a terminating level of a transmission line for transmitting a reception signal including a signal at a first level indicating a preamble by a terminating resistor;
    detecting whether a level of the transmission line is the first level or a second level, the second level being different from the first level;
    adjusting a resistance of the terminating resistor; and
    adjusting the resistance of the terminating resistor to a value such that the level of the transmission line is detected as the second level when a data request is output to a transmitting side.

10. A method for testing a receiving circuit, the method comprising:
    outputting a signal having a first level indicating a preamble from a transmitting circuit to the receiving circuit coupled to a transmission line;
    setting the transmitting circuit to a high impedance;
    adjusting a resistance of a terminating resistor for terminating the transmission line to a value such that a second level different from the first level is detected from the transmission line; and
    setting the transmitting circuit to a low impedance and setting a signal output from the transmitting circuit to the transmission line to the first level.

* * * * *